(12) United States Patent
Kang et al.

(10) Patent No.: US 9,832,885 B2
(45) Date of Patent: Nov. 28, 2017

(54) CIRCUIT BOARD, ELECTRONIC COMPONENT AND METHOD OF MANUFACTURING CIRCUIT BOARD

(71) Applicant: SAMSUNG ELECTRO-MECHANICS CO., LTD., Suwon-Si, Gyeonggi-Do (KR)

(72) Inventors: Myung Sam Kang, Suwon-Si (KR); Ki Jung Sung, Suwon-Si (KR); Seung Yeop Kook, Suwon-Si (KR); Seung Eun Lee, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 220 days.

(21) Appl. No.: 14/722,084

(22) Filed: May 26, 2015

(65) Prior Publication Data

US 2015/0342047 A1 Nov. 26, 2015

(30) Foreign Application Priority Data

May 26, 2014 (KR) .................. 10-2014-0063045

(51) Int. Cl.
| | |
|---|---|
| *H05K 7/10* | (2006.01) |
| *H05K 7/12* | (2006.01) |
| *H05K 3/40* | (2006.01) |
| *H05K 1/18* | (2006.01) |
| *H05K 1/09* | (2006.01) |
| *H05K 3/10* | (2006.01) |
| *H05K 1/11* | (2006.01) |
| *H05K 3/18* | (2006.01) |
| *H05K 3/24* | (2006.01) |

(52) U.S. Cl.
CPC ................ *H05K 3/40* (2013.01); *H05K 1/09* (2013.01); *H05K 1/114* (2013.01); *H05K 1/181* (2013.01); *H05K 3/10* (2013.01); *H05K 3/188* (2013.01); *H05K 3/244* (2013.01); *H05K 2203/049* (2013.01); *Y02P 70/611* (2015.11); *Y10T 29/49156* (2015.01)

(58) Field of Classification Search
CPC .......... H05K 1/09; H05K 1/114; H05K 1/181; H05K 2203/049; H05K 3/10; H05K 3/188; H05K 3/244; H05K 3/40; Y02P 70/611; Y10T 29/49156
See application file for complete search history.

(56) References Cited

U.S. PATENT DOCUMENTS

| | | | |
|---|---|---|---|
| 2001/0035452 A1 | 11/2001 | Test et al. | |
| 2005/0056930 A1* | 3/2005 | Horimoto | H01L 23/49838 257/724 |
| 2007/0164452 A1* | 7/2007 | Lee | H01L 24/03 257/780 |
| 2008/0093109 A1* | 4/2008 | Hsu | H05K 3/243 174/250 |
| 2009/0016671 A1* | 1/2009 | Asai | G02B 6/43 385/14 |

(Continued)

*Primary Examiner* — Yuriy Semenenko
(74) *Attorney, Agent, or Firm* — NSIP Law

(57) ABSTRACT

Disclosed is a circuit board having a contact pad for connection with an external device, which protrudes from an upper surface of an outermost insulating layer. A device can be mounted on the circuit board, and a connection terminal of the device can be connected to the contact pad of the circuit board by a wire etc.

10 Claims, 6 Drawing Sheets

(56) References Cited

U.S. PATENT DOCUMENTS

2010/0103634 A1* 4/2010 Funaya ............... H01L 23/5389
                                                    361/761
2010/0188059 A1* 7/2010 Takano ................ H01L 23/142
                                                    323/234
2014/0027170 A1* 1/2014 Shimadu ................ H05K 1/02
                                                    174/268

* cited by examiner

[FIG. 1]
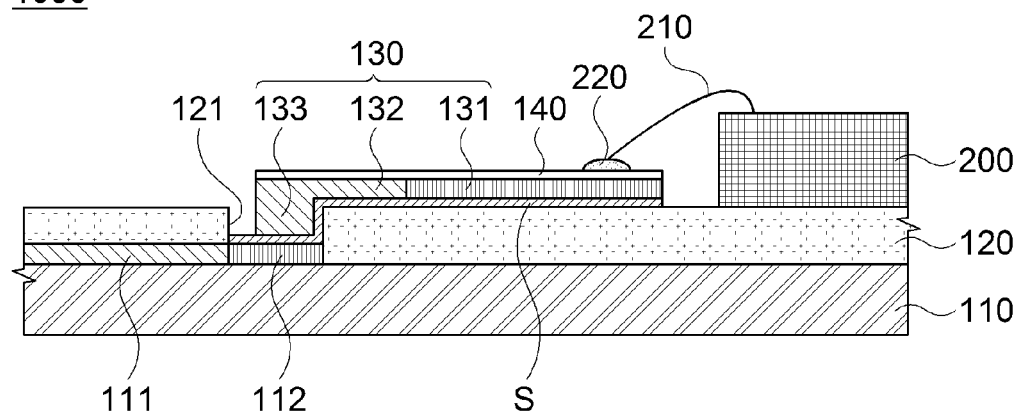
[FIG. 2]
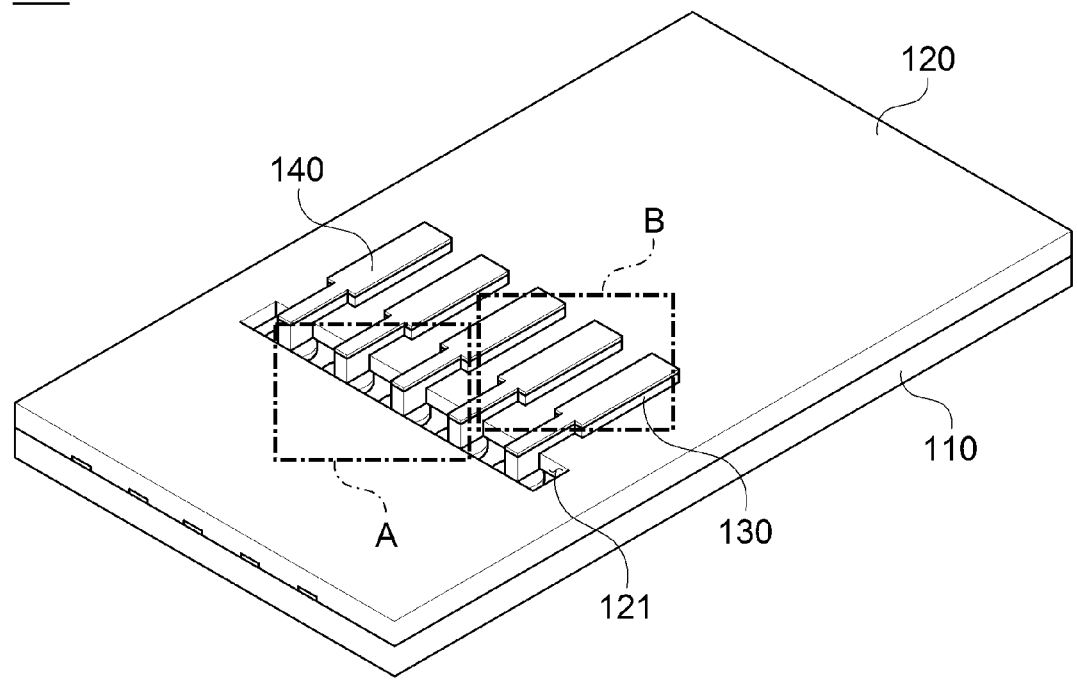

[FIG. 3]
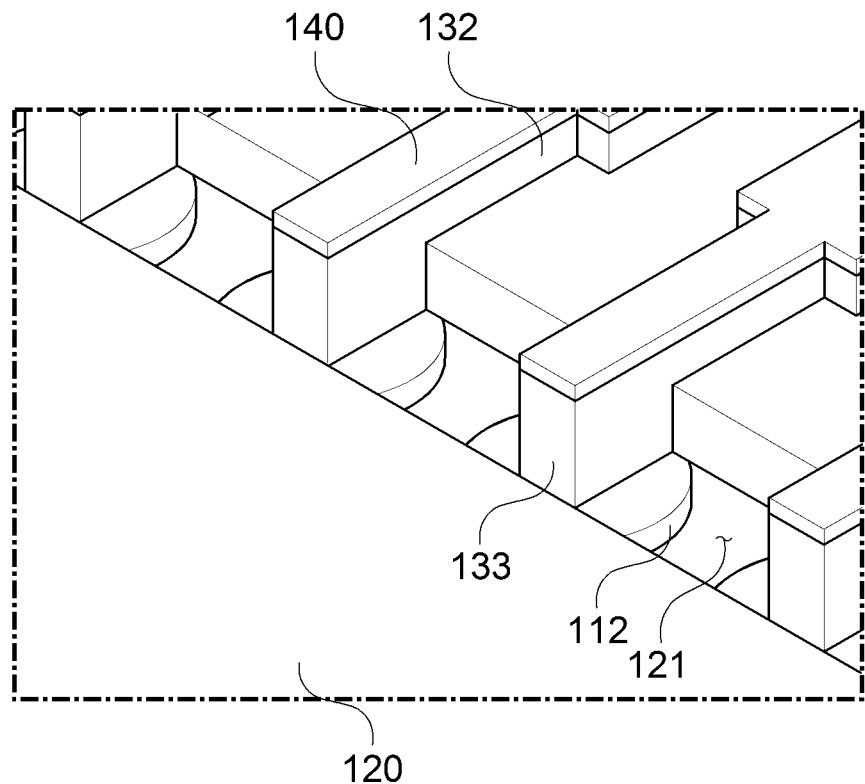
[FIG. 4]
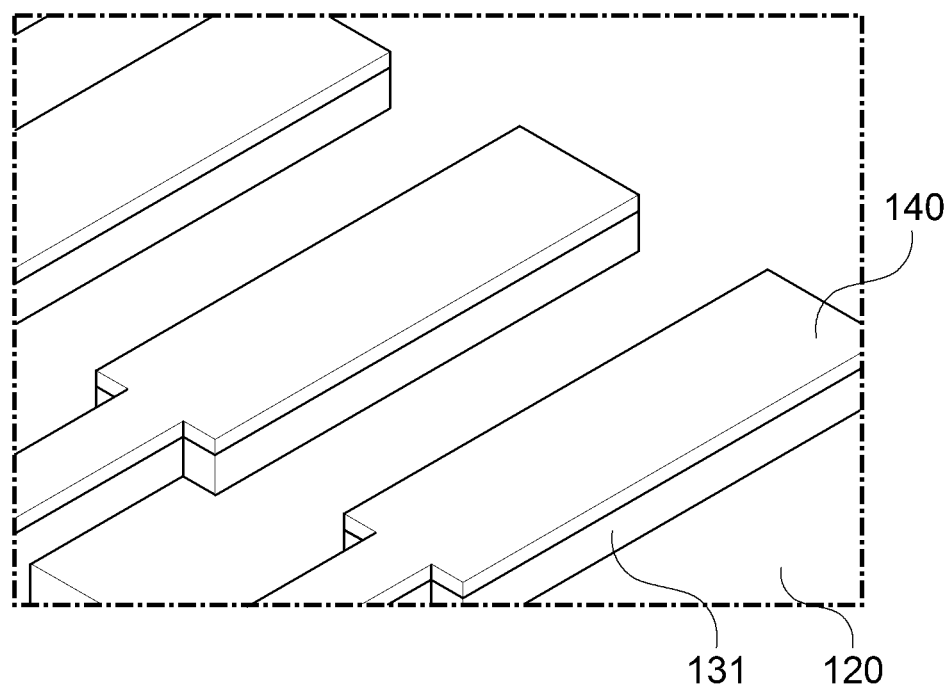

[FIG. 5A]
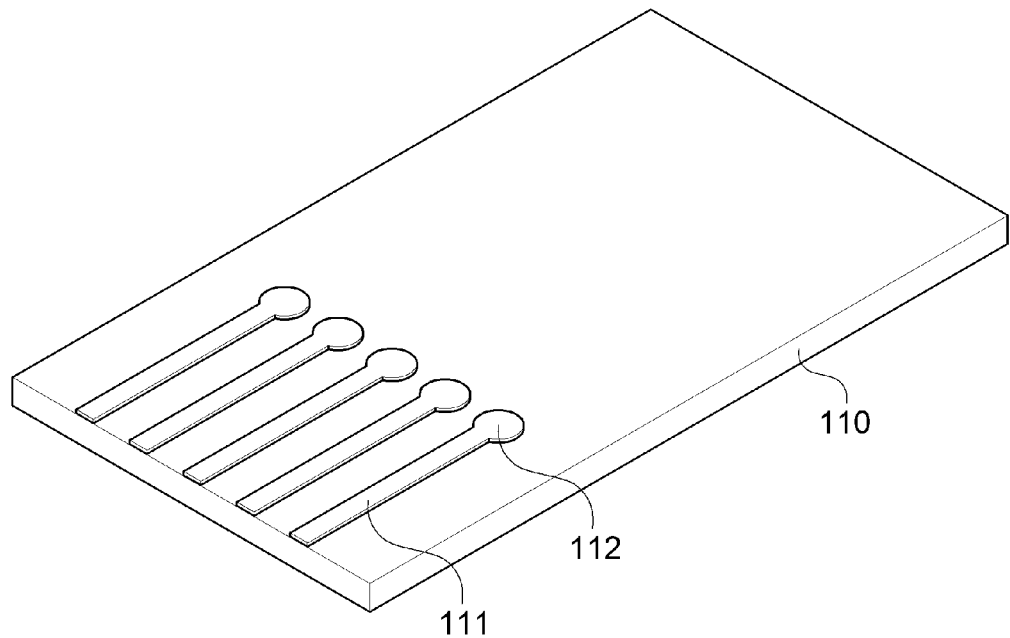
[FIG. 5B]
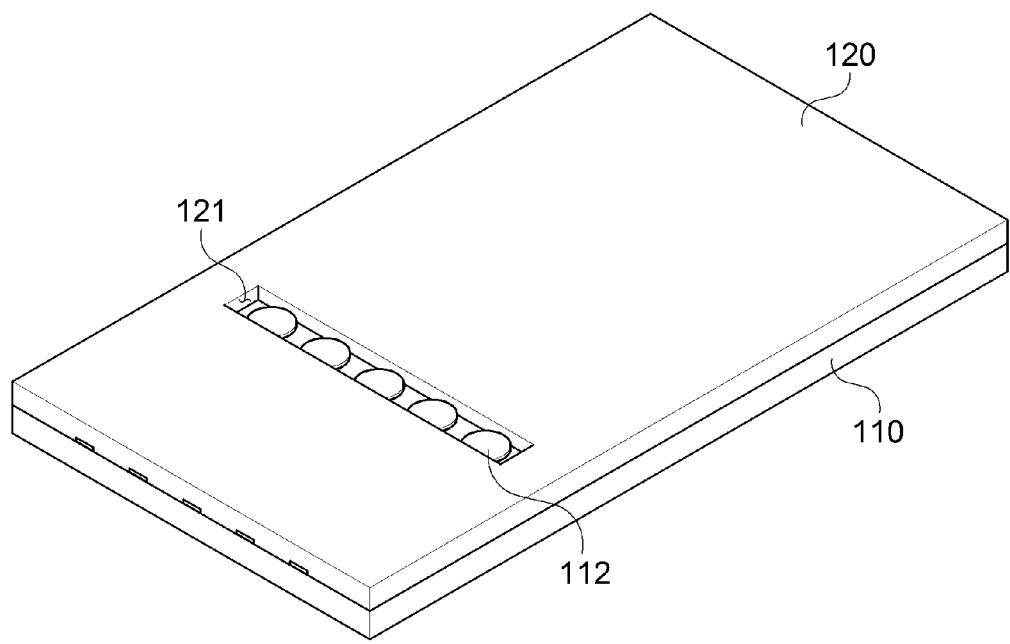

[FIG. 5C]
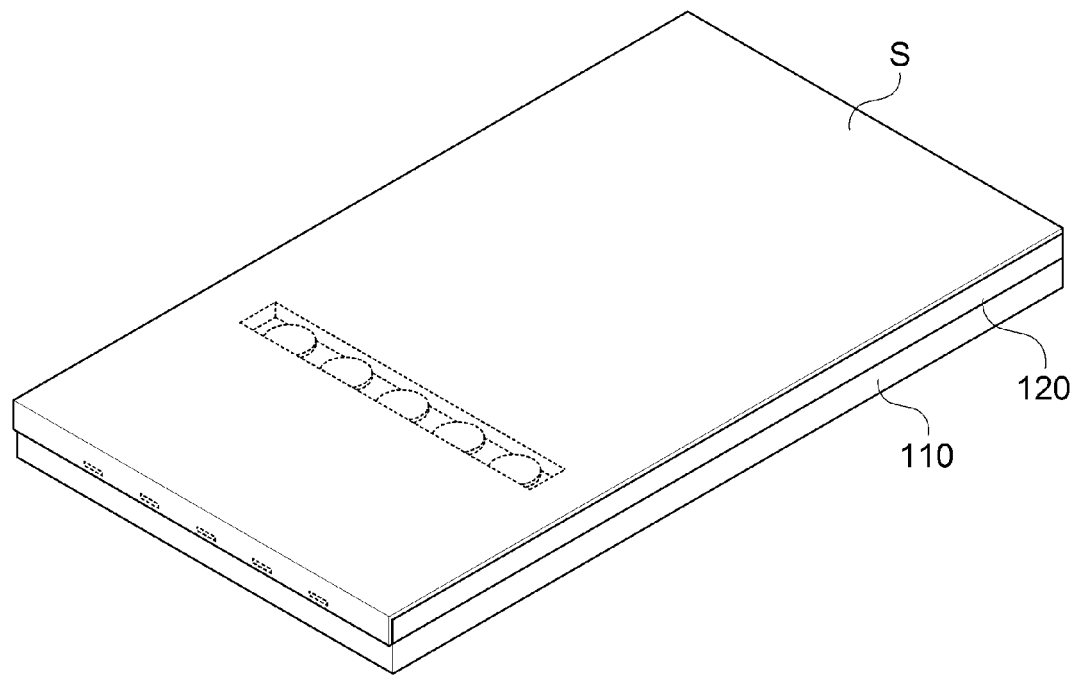
[FIG. 5D]
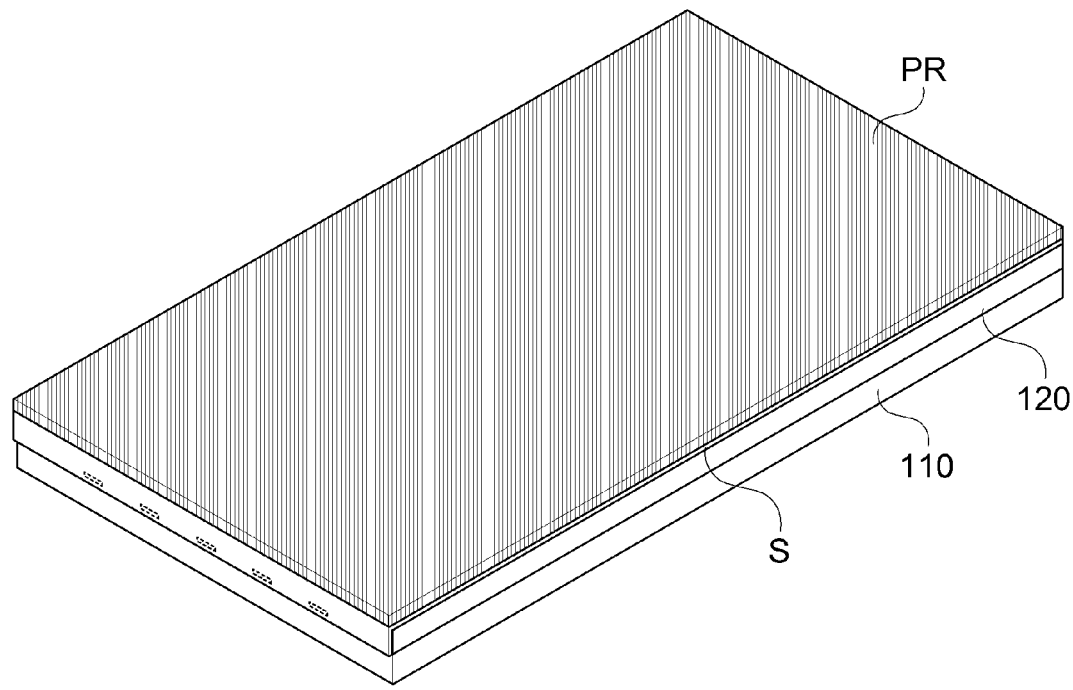

[FIG. 5E]
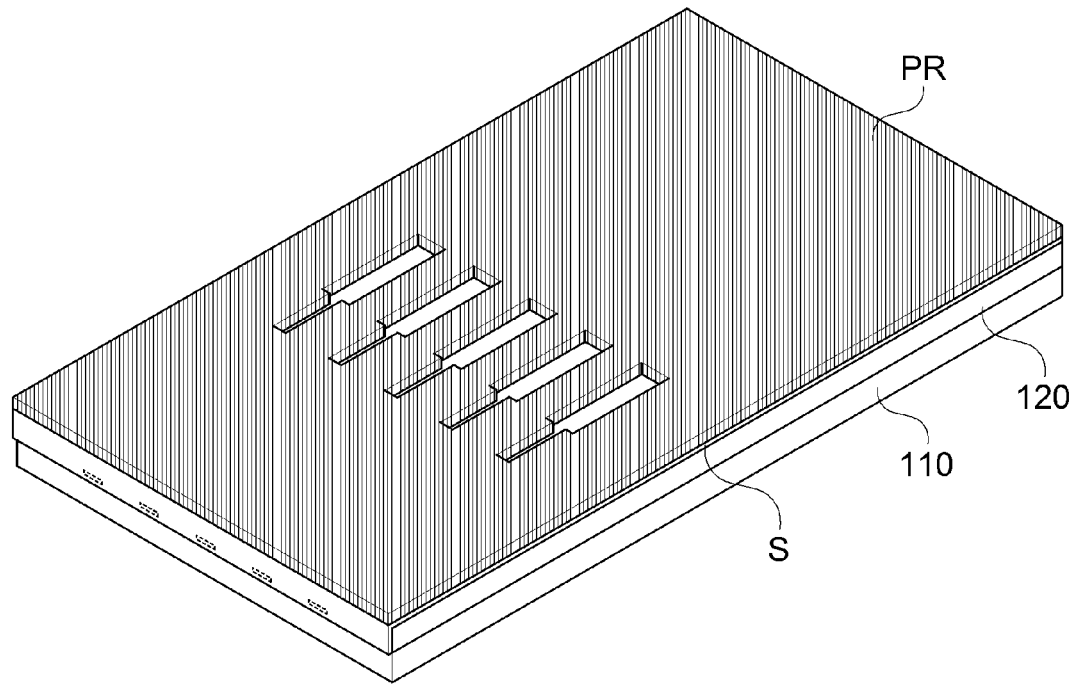
[FIG. 5F]
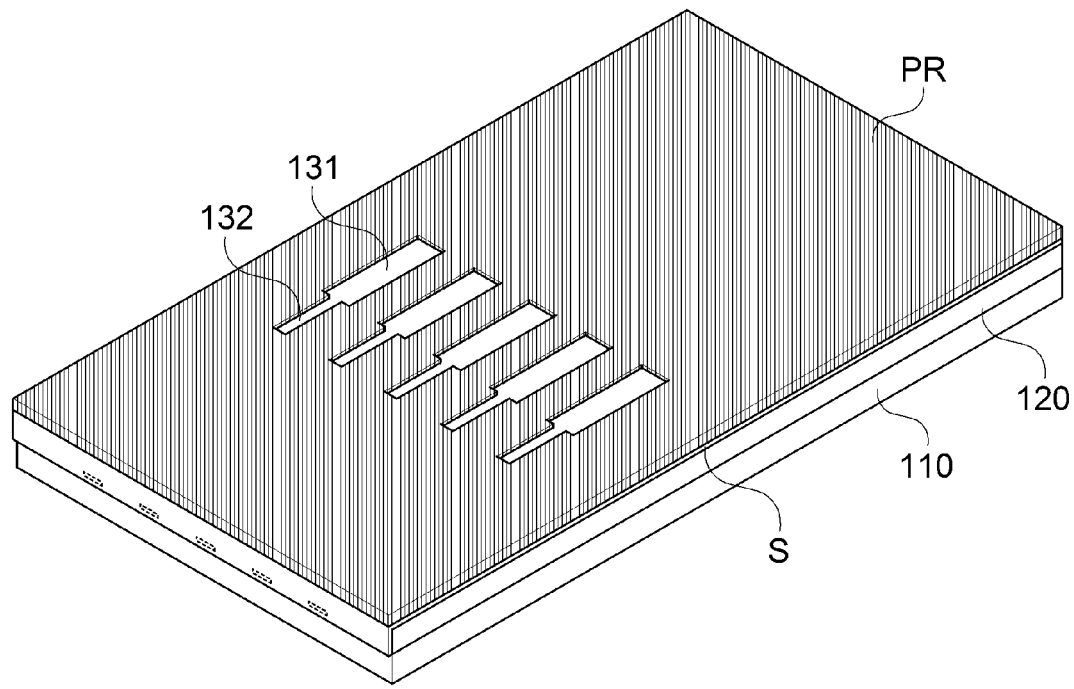

[FIG. 5G]
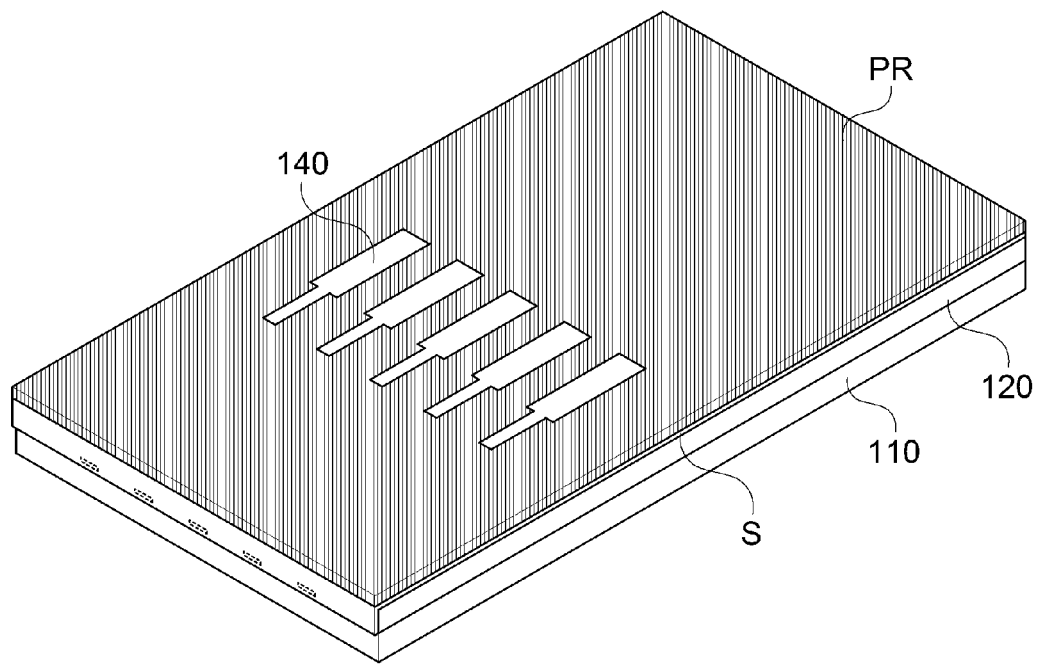
[FIG. 5H]
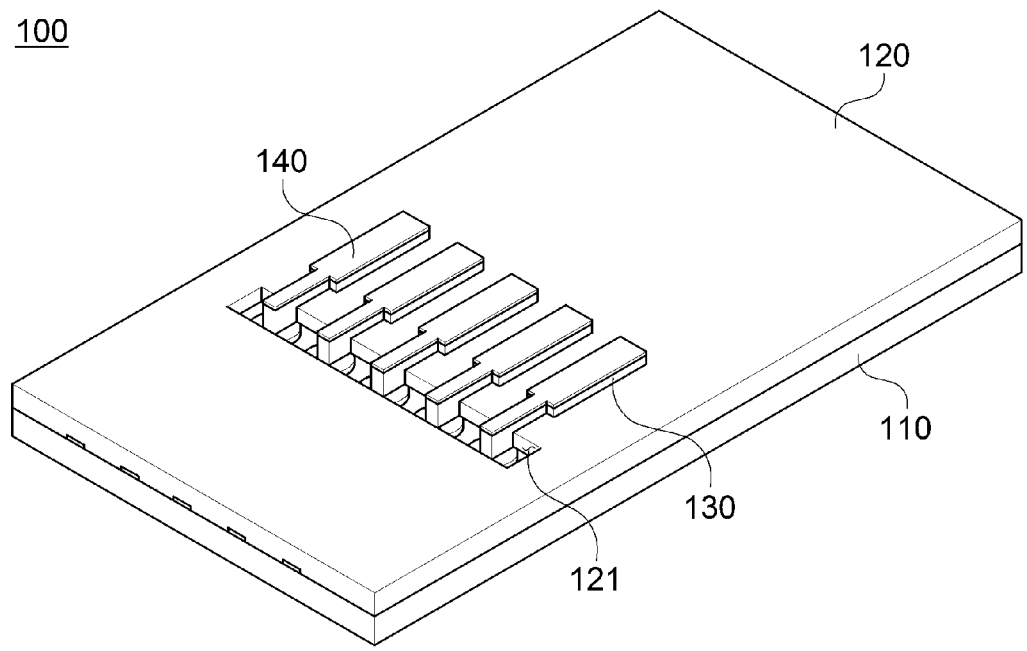

CIRCUIT BOARD, ELECTRONIC COMPONENT AND METHOD OF MANUFACTURING CIRCUIT BOARD

CROSS-REFERENCE TO RELATED APPLICATIONS

Claim and incorporate by reference domestic priority application and foreign priority application as follows:

Cross Reference to Related Application

This application claims the benefit under 35 U.S.C. Section 119 of Korean Patent Application Serial No. 10-2014-0063045, entitled filed May 26, 2014, which is hereby incorporated by reference in its entirety into this application.

BACKGROUND OF THE INVENTION

1. Field of the Invention

The present invention relates to a circuit board.

2. Description of the Related Art

In general, an electronic component or an external device, which is connected to a circuit board, is electrically connected to a contact pad formed on the circuit board by a wire bonding method etc.

In recent times, electronic products are becoming smaller, thinner, and denser. In order to meet this trend, there is a continuous effort to reduce the pitch of the contact pad or to improve the degree of integration of the contact pad. Meanwhile, the larger the width of the contact pad, the higher the reliability of coupling such as wire bonding.

Therefore, it is needed to develop technologies that can secure the width of the contact pad to the maximum while improving the degree of integration of the contact pad.

RELATED ART DOCUMENT

Patent Document

Patent Document 1: US 2001-0035452 A1

SUMMARY OF THE INVENTION

The present invention has been invented in order to overcome the above-described problems and it is, therefore, an object of the present invention to provide a circuit board that can secure the width of a contact pad to the maximum while improving the degree of integration of the contact pad for connection with an external device.

It is another object of the present invention to provide a method of manufacturing a circuit board that can efficiently manufacture a circuit board with reduced signal transmission noise.

Technical objects of the present invention are not limited to the above-mentioned ones, and other technical objects not mentioned above would clearly be understood by those skilled in the art through the following description.

In accordance with one aspect of the present invention to achieve the object, there is provided a circuit board including: a contact pad protruding from an upper surface of an outermost insulating layer.

In an embodiment, the outermost insulating layer may be made of a solder resist.

In an embodiment, an opening may be formed in the outermost insulating layer, and the contact pad may be electrically connected to a lower circuit pattern through the opening.

In an embodiment, a pad plating layer may be provided on the contact pad.

In an embodiment, the pad plating layer may be formed only on an upper surface of the contact pad except a side surface of the contact pad.

In accordance with another aspect of the present invention to achieve the object, there is provided a method of manufacturing a circuit board, which includes the steps of: forming a seed layer and a resist layer on an upper surface of an outermost insulating layer; forming a contact pad; forming a pad plating layer; and removing the resist layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a view schematically showing a circuit board in accordance with an embodiment and an electronic component including the circuit board;

FIG. 2 is a perspective view schematically showing the circuit board in accordance with an embodiment of the present invention;

FIG. 3 is an enlarged perspective view of a portion A of FIG. 2;

FIG. 4 is an enlarged perspective view of a portion B of FIG. 2; and

FIGS. 5A to 5H are process perspective views for explaining a method of manufacturing a circuit board in accordance with an embodiment of the present invention, wherein FIG. 5A schematically shows the state in which a circuit pattern is formed on a first insulating layer, FIG. 5B schematically shows the state in which a second insulating layer is formed, FIG. 5C schematically shows the state in which a seed layer is formed, FIG. 5D schematically shows the state in which a resist layer is formed, FIG. 5E schematically shows the state in which the resist layer is patterned, FIG. 5F schematically shows the state in which a contact pad is formed, FIG. 5G schematically shows the state in which a pad plating layer is formed, and FIG. 5H schematically shows the state in which the resist layer and the seed layer are removed.

DETAILED DESCRIPTION OF THE PREFERABLE EMBODIMENTS

Advantages and features of the present invention and methods of accomplishing the same will be apparent by referring to embodiments described below in detail in connection with the accompanying drawings. However, the present invention is not limited to the embodiments disclosed below and may be implemented in various different forms. The embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

Hereinafter, configurations and operational effects of the present invention will be described in detail with reference to the accompanying drawings.

FIG. 1 is a view schematically showing a circuit board 100 in accordance with an embodiment of the present invention and an electronic component 1000 including the circuit board 100, FIG. 2 is a perspective view schematically showing the circuit board 100 in accordance with an embodiment of the present invention, FIG. 3 is an enlarged perspective view of a portion A of FIG. 2, and FIG. 4 is an enlarged perspective view of a portion B of FIG. 2.

Referring to FIGS. 1 to 4, the circuit board 100 according to an embodiment of the present invention includes a contact pad 130 protruding from an upper surface of an outermost insulating layer.

At this time, the outermost insulating layer means an insulating layer provided in an outermost portion of the circuit board 100. According to an embodiment, the outermost insulating layer may be made of a solder resist.

In an embodiment, a device 200 such as a memory chip may be directly or indirectly coupled to the outermost insulating layer.

Further, a connection terminal may be provided in the device 200, and the connection terminal and the contact pad 130 may be electrically connected to each other. In an embodiment, the connection terminal and the contact pad 130 may be connected by a wire 210 having one end connected to the connection terminal and the other end connected to the contact pad 130. Further, solder 220 may be used to fix the wire 210 to the contact pad 130.

Meanwhile, a first insulating layer 110 and a circuit pattern may be provided under the outermost insulating layer.

At this time, although a circuit pattern portion 111 and a connection pad portion 112 are represented by the separate reference numerals in FIG. 1 to describe the circuit pattern, the circuit pattern portion 111 and the connection pad portion 112 may be integrally formed to implement the circuit pattern.

And, the outermost insulating layer may be referred to as a second insulating layer 120 in that the outermost insulating layer can be provided on the first insulating layer 110.

In an embodiment, the second insulating layer 120 may cover the circuit pattern and the first insulating layer 110.

Accordingly, the second insulating layer 120 can perform a function of protecting the circuit pattern and the first insulating layer 110. For example, the second insulating layer 120 can prevent the circuit pattern formed on the first insulating layer 110 from being exposed to the outside and contaminated. Further, even though the device 200 is mounted on the circuit board 100, the circuit pattern on the first insulating layer 110 cannot be damaged. Further, when the solder 220 is used for the electrical connection between the device 200 and the contact pad 130, the contamination of the circuit pattern by the solder 220 or the unintended connection between the adjacent circuit patterns by the solder 220 can be prevented.

In an embodiment, an opening 121 may be formed in the second insulating layer 120. The opening 121 may be formed above the connection pad portion 112 to expose the connection pad portion 112 to the outside of the second insulating layer 120. And, one end of the contact pad 130 may extend to the inside of the opening 121 to be in contact with the connection pad portion 112. The portion of the contact pad 130, which extends to the inside of the opening 121, may be referred to as a connection pattern portion 133. The drawing shows an example in which a seed layer S is provided between the connection pad portion 112 and the connection pattern portion 133. Here, the seed layer S may play the role of a seed for performing a plating process and may be implemented with a conductive material such as copper. When the seed layer S is implemented with copper and the connection pad portion 112 or the connection pattern portion 133 is implemented with a copper material, the boundary between the connection pad portion 112 or the connection pattern portion 133 and the seed layer S may not be clearly identified. In this respect, the seed layer S shown in FIG. 1 can be seen as a portion of the connection pattern portion 133 or the connection pad portion 112. And, in FIGS. 2 to 4, the seed layer S is not shown to be identified separately.

In an embodiment, a contact pad portion 131 may be provided on an upper surface of the second insulating layer 120, and the connection pattern portion 133 and the contact pad portion 131 may be connected by a conductive pattern portion 132. Although the contact pad portion 131, the conductive pattern portion 132, and the connection pattern portion 133 are represented by the separate reference numerals in FIG. 1 to describe the contact pad 130, the contact pad portion 131, the conductive pattern portion 132, and the connection pattern portion 133 may be integrally formed to implement the contact pad 130.

Meanwhile, a pad plating layer 140 may be provided on an upper surface of the contact pad 130. In an embodiment, the contact pad 130 may be made of a conductive material such as copper. At this time, the pad plating layer 140 performs a function of preventing the oxidation or contamination of the surface of the contact pad 130 and closely coupling the 210 or the solder 220 to the contact pad 130. In an embodiment, the pad plating layer 140 may be implemented by gold plating. The pad plating layer 140 may be implemented by nickel plating when necessary. Furthermore, the pad plating layer 140 may be formed by sequentially forming a nickel plating layer and a gold plating layer on the surface of the contact pad 130. Further, the pad plating layer 140 may be implemented with an alloy containing at least one of nickel and gold.

In an embodiment, the pad plating layer 140 may be formed only on the upper surface of the contact pad 130. That is, the pad plating layer 140 is not formed on a side surface of the contact pad 130. If the contact pads 130 have the same width, when comparing the case in which the plating layer is formed on the side surface of the contact pad 130 with the case in which the plating layer is not formed on the side surface of the contact pad 130, the latter is advantageous to the improvement of the degree of integration of the contact pad 130.

Therefore, as the pad plating layer 140 is formed only on the upper surface of the contact pad 130 except the side surface of the contact pad 130, the degree of integration of the contact pad 130 can be improved while maximizing the width of the contact pad 130.

Meanwhile, the portion in which the pad plating layer 140 is not formed, for example, the side surface portion of the contact pad 130 may be surface-treated with organic materials etc. Here, the surface treatment may be an organic solderability preservative (OSP) treatment or a brown oxide treatment.

And, although the drawing shows that only the first insulating layer 110 is provided under the outermost insulating layer, that is, the second insulating layer 120, the insulating layer may be additionally provided when necessary, and wiring patterns may be formed on one surface or the inside of the insulating layers.

FIGS. 5A to 5H are process perspective views of a method of manufacturing a circuit board 100 in accordance with an embodiment of the present invention.

Referring to FIGS. 5A to 5H, the method of manufacturing a circuit board 100 according to an embodiment of the present invention may form a seed layer S and a resist layer on an outermost insulating layer, that is, a second insulating layer 120 and form a contact pad 130 by patterning the resist layer. According to an embodiment, the resist layer and the seed layer S may be removed after a pad plating layer 140 is formed on an upper surface of the contact pad 130.

First, as shown in FIG. 5A, a circuit pattern may be formed on a first insulating layer 110.

Next, as shown in FIG. 5B, the second insulating layer 120 may be formed to cover the first insulating layer 110 and the circuit pattern. At this time, an opening 121 may be formed in the second insulating layer 120, and at least a portion of a connection pad portion 112 may be exposed through the opening 121.

Next, as shown in FIG. 5C, the seed layer S may be formed. At this time, the seed layer S may cover a surface of the second insulating layer 120, the inside of the opening 121, and a surface of the connection pad portion 112 exposed by the opening 121.

Next, as shown in FIG. 5D, a resist layer PR may be formed to cover the seed layer S. Here, the resist layer PR may be formed using a liquid resist to fill the resist to the inside of the opening 121.

Next, as shown in FIG. 5E, the resist layer PR may be patterned. A resist in a region where a contact pad 130 is to be formed may be removed by the patterning. Accordingly, the seed layer S in the region where the contact pad 130 is to be formed can be exposed. In an embodiment, this patterning process may be performed by exposure and developing processes. Further, at least a portion of the region from which the resist is removed by the patterning process may be overlapped with the above-described opening 121. Accordingly, a portion of the contact pad 130 and the above-described connection pad portion 112 can be in contact with each other when a subsequent process is performed.

Next, as shown in FIG. 5F, the contact pad 130 may be formed. Here, a process of forming the contact pad 130 may be performed by a plating process. That is, the contact pad 130 may be formed by filling a conductive material in at least a portion of the inside of the resist layer PR.

Next, as shown in FIG. 5G, the pad plating layer 140 may be formed on the upper surface of the contact pad 130. As shown in FIG. 5H, the resist layer PR and the seed layer S may be removed. In an embodiment, a process of forming the pad plating layer 140 may be performed in a state in which the resist layer PR is not removed after the contact pad 130 is formed. Accordingly, the pad plating layer 140 is formed only on the upper surface of the contact pad 130 and is not formed on a side surface of the contact pad 130. In an embodiment, the pad plating layer 140 may be formed by an electroplating method. Here, a separate plating lead line is not needed by directly applying power to the seed layer S. Further, a separate process of removing a plating lead line is not needed. The plating lead line is a cause of noise in a situation in which a signal transmission speed is being rapidly increased. Therefore, when a plating lead line is needed in a manufacturing process, a separate process of removing a plating lead line from the final product should be performed, but according to an embodiment of the present invention, a separate plating lead line is not needed or it is not needed to perform a separate process of removing a plating lead line.

According to an embodiment of the present invention, it is possible to secure the width of a contact pad to the maximum while improving the degree of integration of the contact pad for connection with an external device.

According to an embodiment of the present invention, it is possible to efficiently manufacture a circuit board with reduced signal transmission noise.

What is claimed is:
1. A circuit board comprising:
a first insulating layer;

a circuit pattern disposed on an upper surface of the first insulating layer and comprising a circuit patter portion and a connection pad portion;

a second insulating layer made of a solder resist and formed on the first insulating layer and the circuit pattern so as to cover the circuit pattern, the second insulating layer having an opening formed therein to expose at least a portion of the connection pad portion; and a contact pad formed on an upper surface of the second insulating layer and on an inner wall of the opening, one end of the contact pad being in contact with the connection pad portion to be electrically connected to the connection pad portion.

2. The circuit board according to claim 1, further comprising:

a pad plating layer provided on a surface of the contact pad and made of a conductive material different from that of the contact pad.

3. The circuit board according to claim 2, wherein the pad plating layer is provided only on an upper surface of the contact pad except a side surface of the contact pad.

4. The circuit board according to claim 3, wherein the pad plating layer is made of at least one material selected from nickel and gold or an alloy containing at least one material selected from nickel and gold.

5. The circuit board according to claim 1, wherein the contact pad is for wire bonding.

6. The circuit board according to claim 1, wherein a side surface of the contact pad is surface-treated with an organic material.

7. The circuit board according to claim 2, wherein the exposed surface of the contact pad is surface-treated with an organic material.

8. An electronic component comprising:

a device having a connection terminal and mounted on a circuit board according to claim 1, wherein the connection terminal is wire-bonded to the contact pad.

9. A circuit board comprising:

a first insulating layer;

a circuit pattern disposed on an upper surface of the first insulating layer and comprising a circuit patter portion and a connection pad portion;

a second insulating layer made of a solder resist and formed on the first insulating layer and the circuit pattern so as to cover the circuit pattern, the second insulating layer having an opening formed therein to expose at least a portion of the connection pad portion;

a contact pad made of a first material having conductivity and formed on an upper surface of the second insulating layer and on an inner wall of the opening, one end of the contact pad being in contact with the connection pad portion to be electrically connected to the connection pad portion; and a pad plating layer made of a second material, which is different from the first material while having conductivity, and formed to protrude from an upper surface of the contact pad.

10. The circuit board according to claim 9, wherein the pad plating layer is provided in a region except a side surface of the contact pad.

* * * * *